United States Patent [19]
Harman

[11] Patent Number: 6,060,657
[45] Date of Patent: May 9, 2000

[54] LEAD-CHALCOGENIDE SUPERLATTICE STRUCTURES

[75] Inventor: Theodore C. Harman, Lexington, Mass.

[73] Assignee: Massachusetts Institute of Technology, Cambridge, Mass.

[21] Appl. No.: 09/104,271

[22] Filed: Jun. 24, 1998

[51] Int. Cl.$^7$ .................................................. H01L 35/14
[52] U.S. Cl. .................... 136/239; 136/238; 136/203; 136/205; 257/15; 428/457; 428/689; 428/697; 428/699
[58] Field of Search .................... 136/203, 205, 136/212, 238, 239; 257/15; 428/689, 697, 699, 457

[56] References Cited

U.S. PATENT DOCUMENTS

| | | | |
|---|---|---|---|
| 2,588,254 | 3/1952 | Lark-Horovitz et al. | 136/89 |
| 2,798,989 | 7/1957 | Welker | 317/237 |
| 3,124,936 | 3/1964 | Melehy | 62/3 |
| 3,259,759 | 7/1966 | Giaever | 307/88.5 |
| 3,296,033 | 1/1967 | Scuro et al. | 136/205 |
| 3,338,753 | 8/1967 | Horsting | 136/237 |
| 3,342,567 | 9/1967 | Dingwall | 29/195 |
| 3,626,583 | 12/1971 | Abbott et al. | 29/573 |
| 3,674,568 | 7/1972 | Caprarola | 136/205 |
| 3,873,370 | 3/1975 | Hampl, Jr. et al. | 136/205 |
| 4,029,520 | 6/1977 | Hampl, Jr. et al. | 136/205 |
| 4,261,771 | 4/1981 | Dingle et al. | 148/175 |
| 4,368,416 | 1/1983 | James | 322/2 R |
| 4,469,977 | 9/1984 | Quinn et al. | 310/334 |
| 4,620,897 | 11/1986 | Nakajima | 156/602 |
| 4,664,960 | 5/1987 | Ovshinsky | 428/98 |
| 4,786,335 | 11/1988 | Knowles et al. | 136/214 |
| 4,847,666 | 7/1989 | Heremans et al. | 357/16 |
| 4,855,810 | 8/1989 | Gelb et al. | 357/87 |
| 4,869,971 | 9/1989 | Nee et al. | 428/635 |
| 5,006,178 | 4/1991 | Bijvoets | 136/211 |
| 5,021,224 | 6/1991 | Nakajima | 422/248 |
| 5,051,786 | 9/1991 | Nicollian et al. | 357/4 |
| 5,064,476 | 11/1991 | Recine, Sr. | 136/201 |
| 5,156,004 | 10/1992 | Wu et al. | 62/3.1 |
| 5,181,086 | 1/1993 | Yoshida | 257/18 |
| 5,210,428 | 5/1993 | Goossen | 257/17 |
| 5,288,336 | 2/1994 | Strachan et al. | 136/200 |
| 5,415,699 | 5/1995 | Harman | 136/238 |
| 5,436,467 | 7/1995 | Elsner et al. | 257/15 |
| 5,550,387 | 8/1996 | Elsner et al. | 257/15 |
| 5,900,071 | 5/1999 | Harman | 136/236.1 |

FOREIGN PATENT DOCUMENTS

| | | |
|---|---|---|
| 0437654 | 7/1991 | European Pat. Off. . |
| 08125237 | 5/1996 | Japan . |
| 1216001 | 12/1970 | United Kingdom . |

OTHER PUBLICATIONS

T.E. Whall and E.H.C. Parker, "Preparation of Advanced Materials by Molecular Beam Epitaxy," in *Proc. First Europe Conf. Thermoelectrics*, D.M. Rowe, ed. (Peter Peregrinus Ltd., London 1987) Chapter 5, pp. 51–63. No Month Given.

Katsuya Oda and Takashi Nakayama, "Effects of Interface Atomic Configurations on Electronic Structures of Semiconductor Superlattices," *Jpn. J. Appl. Phys.* Aug. 1992, vol. 31, Part 1, No. 8, pp. 2359–2368.

(List continued on next page.)

*Primary Examiner*—Kathryn Gorgos
*Assistant Examiner*—Thomas H Parsons
*Attorney, Agent, or Firm*—Daly, Crowley & Mofford, LLP

[57] ABSTRACT

A superlattice structure having a relatively high thermoelectric figure of merit and suitable for usage in power generation systems, and in heating and/or cooling applications is described. The superlattice structure includes a first plurality of layers formed from material $D_zJ_{1-z}$, a second plurality of layers formed from material $L_xM_{1-x}D_zJ_{1-z}$ and a third plurality of layers formed from material $L_xM_{1-x}D_zJ_{1-z}$ wherein D is a non-metal chalcogen, and wherein J is a non-metal chalcogen, and wherein L is a group IV metal selected from the group of Pb, Sn, and Ge, and wherein M is a Group IV metal selected from the group of Pb, Sn, and Ge, and wherein D is not the same as J, and wherein L is not the same as M, and wherein $0 \leq x \leq 1$ and $0 \leq z \leq 1$.

25 Claims, 7 Drawing Sheets

Kaoru Inoue, et al., "Electron Mobilities in Modulation-Doped $Al_xGa_{i-x}As/GaAs$ and Pseudomorphic $Al_xGa_{i-x}As/In_yGa_{i-y}As$ Quantum–Well Structures," *Physical Review B*, Feb. 1993, vol. 47, No. 7, pp. 3771–3778.

Mark L. Biermann, et al., "Wave–Packet Theory of Coherent Carrier Dynamics in a Semiconductor Superlattice," *Physical Review B*, Feb., 1993, vol. 47, No. 7, pp. 3718–3717.

L.D. Hicks, et al., "Use of Quantum–well Superlattices to Obtain a High Figure of Merit from Non–Conventional Thermoelectric Materials" Dec. 1993 *Appl. Phys. Lett.* vol. 63(23), pp. 3230–3232.

G.D. Mahan, et al., "Thermoelectric Devices Using Semiconductor Quantum Wells" Aug. 1994, *J. Appl. Phys.* vol. 76 (3), pp. 1899–1901.

X. Sun, et al., "Quantum Confinement Effects on the Thermoelectric Figure of Merit in $Si/Si_{1-x}Ge$ System" 1997 *Mat. Res. Soc. Symp. Proc.* vol. 478. No Month Given.

L.D. Hicks, et al., "Experimental Study of the Effect of Quantum–Well Structures on the Thermoelectric Figure of Merit" Apr. 1996 *Physical Review B*, vol. 53, No. 16.

L.D. Hicks, et al., "Thermoelectric Figure of Merit of a One–Dimensional Conductor" Jun. 1993, *Physical Review B*, vo. 47, No. 24.

T.C. Harman, et al. "High Thermoelectric Figures of Merit in PbTe Quantum Wells" Jul. 1996 *Journal of Electronic Materials*, vol. 25, No. 7.

Farmer, et al., "Sputter Deposition of Multilayer Thermoelectric Films: An Approach to the Fabrication of Two Dimensional Quantum Wells" 1995, XIII Intl. Conf. on Therm., *American Institute of Physics*. No Month Given.

M. S. Dresselhaus, et al., "Prospects for High Thermoelectric Figures of Merit in 2D System," 1997 *Mat. Res. Soc. Symp. Proc.* vol. 478. No Month Given.

L. D. Hicks, et al., "Use of Quantum–Well Superlattices to Increase the Thermoelectric Figure of Merit: Transport and Optical Studies," 1995 *Mat. Res. Soc. Symp. Proc.* vol. 358. No Month Given.

L. D. Hicks, "Effect of Quantum–Well Structures on the Thermoelectric Figure of Merit," 1993 *Physical Review B* vol. 47, No. 19. No Month Given.

LEAD-CHALCOGENIDE SUPERLATTICE STRUCTURES

STATEMENT REGARDING FEDERALLY-SPONSORED RESEARCH

This invention was made with government support under Contract No. F19628-95C-0002 awarded by the Department of the Navy, the Army Research Office and the Defense Advanced Research Projects Agency (DARPA). The government has certain rights in the invention.

CROSS REFERENCE TO RELATED APPLICATIONS

Not applicable.

FIELD OF THE INVENTION

This invention relates generally to superlattice structures, and more particularly to lead-chalcogenide superlattice structures useful for power generation systems, or for systems which find use in heating and/or cooling applications.

BACKGROUND OF THE INVENTION

As is known in the art, there exists a class of materials referred to as thermoelectric materials. A thermoelectric material is a type of material which can directly convert thermal energy into electrical energy or vice versa.

Although certain thermoelectric materials have been known in the art for a number of years (e.g.—bulk semiconductors), it has only recently been found that thermoelectric materials having a superlattice structure can possess thermoelectric properties which are better than the corresponding thermoelectric properties of other thermoelectric materials.

A superlattice structure denotes a composite structure made of alternating ultrathin layers of different component materials. A superlattice structure typically has an energy band structure which is different than, but related to, the energy band structures of its component materials. The selection of the component materials of a superlattice structure, and the addition of relative amounts of those component materials, will primarily determine the resulting properties of a superlattice structure as well as whether, and by how much, those properties will differ from those of the superlattice structure's component material antecedents.

It is generally known that thermoelectric materials and thermoelectric materials having a superlattice structure find application in the fields of power generation systems, and the heating and/or cooling of materials. One problem, however, is that although these fields place ever-increasing demands on thermoelectric materials to possess ever-improving thermoelectric performance characteristics, the thermoelectric materials and thermoelectric materials having a superlattice structure known in the art have, as of yet, not been able to keep pace with such performance demands.

One way to predict the thermoelectric behavior of thermoelectric materials or thermoelectric materials having a superlattice structure in the fields of power generations systems, and the heating and/or cooling of materials is to calculate a thermoelectric figure of merit for the materials. The thermoelectric figure of merit, ZT, is a dimensionless material parameter in which T corresponds to temperature and Z is the figure of merit. ZT is a measure of the utility of a given thermoelectric material or thermoelectric materials having a superlattice structure in power generation systems, and heating and/or cooling applications at a temperature T.

The relationship of ZT to the material properties of thermoelectric materials and thermoelectric materials having a superlattice structure is shown by the following equation:

$$ZT = S^2 \sigma T/\kappa = S^2 n e \mu T/(\kappa_1 + \kappa_e) = P_F T/\kappa = S^2 GT/K$$

in which S, $\sigma$, T and $\kappa$ are, respectively, the Seebeck coefficient, the electrical conductivity, the temperature, and the thermal conductivity and where n, e, $\mu$, $\kappa_1$ and $\kappa_e$ are, respectively, the carrier density, the electronic charge, the carrier mobility, the lattice part of the thermal conductivity and the electronic part of the thermal conductivity, and where $P_F$ is the power factor, and where G and K are, respectively, the electrical conductance and the thermal conductance.

Generally, it is known in the art that it is desirable for thermoelectric materials to have a relatively high value for their thermoelectric figure of merit (ZT) in order for those thermoelectric materials to perform well in the fields of power generation systems, and the heating and/or cooling of materials. From inspection of the above equation, it appears that to provide a thermoelectric material having a high ZT, one need only fabricate on it a superlattice structure having relatively high values for its Seebeck coefficient, its electrical conductivity, and its temperature while, at the same time, having a relatively low value for its thermal conductivity.

It has proven difficult in practice to provide a thermoelectric material or a thermoelectric material having a superlattice structure that has a high thermoelectric figure of merit (ZT) value. Past findings in the art have suggested that the inherent interrelationships between the material properties included in the above equation for ZT such as carrier mobility, lattice thermal conductivity, power factor and Seebeck coefficient may limit, or place a ceiling upon, the ZT values of thermoelectric materials or thermoelectric materials having a superlattice structure.

For example, thermoelectric materials such as Bismuth Telluride ($Bi_2Te_3$) and Bismuth-Antimony (BiSb) have been used in the art to provide multistage thermoelectric modules (i.e. modules composed of two or more stages of thermoelectric materials, each stage being designed to maximize ZT over a specific temperature range). $Bi_2Te_3$ and BiSb module materials, however, are incapable of efficient heat removal below a temperature of approximately 180° K., and have a thermoelectric figure of merit (ZT) less than one. Thus, multistage thermoelectric modules do not have the desired efficiency to be useful in the wide range of temperatures encountered in many thermoelectric applications.

Another type of thermoelectric material known in the art is provided from lead selenide-telluride (PbSeTe) alloys. While the thermal conductivities of such alloys are low and thermal conductivity, as shown in the above equation, is inversely proportional to ZT, any resulting improvement to the ZT value of PbSeTe alloys as a result of their low thermal conductivities is offset by their relatively low carrier mobilities.

SUMMARY OF THE INVENTION

Still another family of thermoelectric materials have a superlattice structure provided from lead-europium-chalcogenide (Pb-Eu-chalcogenide) materials, and in particular, $Pb_{1-x}Eu_xTe/PbTe$ molecular quantum well structures. Such superlattice structures have a relatively high two-dimensional thermoelectric figure of merit ($Z_{2D}T$). $Z_{2D}T$, however, only corresponds to the quantum well portion of the superlattice where quantum confinement is involved. One problem with such superlattice structures is that their three-dimensional thermoelectric figure of merit ($Z_{3D}T$), which corresponds to the barrier and well portions of the superlattice, may be limited by, among other things, the thermal conductance of the inactive barrier layers such that the $Z_{3D}T$ of Pb-Eu-chalcogenide materials is, at best, only slightly improved over that of bulk thermoelectric materials. Thus, it is believed that the high $Z_{2D}T$ in Eu-Pb-Chalcogenides is caused by quantum carrier confinement and that the low $Z_{2D}T$ is caused by the relatively high thermal conductance of the barrier and other effects.

In view of the above, it would be desirable to provide a thermoelectric material or materials having a superlattice structure which have a relatively high thermoelectric figure of merit and which are suitable for usage in power generation systems, and in heating and/or cooling applications.

In accordance with the present invention, a superlattice structure includes a first plurality of layers formed from material $D_zJ_{1-z}$, a second plurality of layers formed from material $L_xM_{1-x}D_zJ_{1-x}$ and a third plurality of layers formed from material $L_xM_{1-x}D_zJ_{1-x}$ wherein D is a non-metal chalcogen, and wherein J is a non-metal chalcogen, and wherein L is a group IV metal selected from the group of Pb, Sn, and Ge, and wherein M is a Group IV metal selected from the group of Pb, Sn, and Ge, and wherein D is not the same as J, and wherein L is not the same as M, and wherein $0 \leq x \leq 1$ and $0 \leq z \leq 1$. With this particular arrangement, a superlattice structure is provided having a relatively high thermoelectric figure of merit (ZT).

In one particular embodiment of the present invention, a superlattice structure ("SL") is provided on a thermoelectric material wherein the superlattice structure is comprised of alternating layers of lead-telluride (PbTe), lead-selenide-telluride (PbSeTe) and tellurium (Te) (PbTe/PbSeTe/Te). The PbSeTe layers of the PbTe/PbSeTe/Te SL have a composition of $PbSe_xTe_{1-x}$, where $0 \leq x \leq 1$; in this embodiment, x can, but is not required to, equal 0.98.

The PbTe/PbSeTe/Te SL has had measured ZT values up to 1.6. This high value of ZT for a PbTe/PbSeTe/Te SL is due at least in part to the PbTe/PbSeTe/Te SL having a relatively high power factor, a relatively low lattice thermal conductivity and a relatively high Seebeck coefficient.

The PbTe/PbSeTe/Te SL has a lattice thermal conductivity more than twice as low as typical lattice thermal conductivity values of thermoelectric materials known in the art. Moreover, the lattice layer combinations of the PbTe/PbSeTe/Te SL give rise to a high power factor value. Additionally, the value of the Seebeck coefficient of the PbTe/PbSeTe/Te SL is also high because the SL has potential barriers which act as carrier scatterers and which skew the electron distribution function.

The differences in the values of material properties such as power factor, lattice thermal conductivity and Seebeck coefficient for the PbTe/PbSeTe/Te SL, as compared to the values of those material properties for thermoelectric materials and thermoelectric materials having a superlattice structure known in the art, are a result of a variety of interrelated factors including, but not limited to: bismuth (Bi) doping in its PbTe layer, the presence of a thin undoped adsorbed Te layer, the presence of an insulating barium-fluoride ($BaF_2$) substrate and the growth via molecular beam epitaxy of high quality SL interfaces which allow each period of the PbTe/PbSeTe/Te superlattice to have optimized layers of PbTe, PbSeTe and Te.

Additionally, the PbTe/PbSeTe/Te SL exhibits three desirable characteristics: lattice parameters and thermal expansion coefficients that are nearly matched to each other and to the substrate material, barrier thicknesses great enough scatter the conduction electrons and to skew the electron energy distribution, and low lattice thermal conductance.

What further differentiates the PbTe/PbSeTe/Te SL from the thermoelectric materials and the thermoelectric materials having a superlattice structure of the prior art is that its lower lattice thermal conductivity value, its higher power factor value and its higher Seebeck coefficient value are not commensurately offset by a correspondingly low carrier mobility value and/or a lower electrical conductivity value. The properties of the PbTe/PbSeTe/Te SL therefore are advantageously interrelated. These properties have combined to produce a ZT value for the PbTe/PbSeTe/Te SL that is higher than any superlattice or thermoelectric material previously known in the art. Moreover, it is possible that through additional experimentation, these already advantageously-interrelated properties could be further improved to further raise the ZT of the PbTe/PbSeTe/Te SL.

In another embodiment of the present invention, a superlattice is provided having alternating layers of lead-telluride (PbTe) and lead-selenide-telluride (PbSeTe) (hereafter "PbTe/PbSeTe SL"). The PbSeTe layers of the PbTe/PbSeTe SL have a composition of $PbSe_xTe_{1-x}$, where $0 \leq x \leq 1$; in this embodiment, x can, but is not required to, equal 0.98.

Although the PbTe/$PbSe_xTe_{1-x}$ SL differs from the PbTe/$PbSe_xTe_{1-x}$/Te SL described above, it shares many of the same differences from, and advantages over, the prior art thermoelectric materials as does the PbTe/$PbSe_xTe_{1-x}$/Te SL. Moreover, the PbTe/$PbSe_xTe_{1-x}$ SL also possesses many of the same advantageously interrelated materials properties of the PbTe/PbSeTe/Te SL. Therefore, the PbTe/$PbSe_xTe_{1-x}$ SL also should have high values for its thermoelectric figure of merit (ZT).

In yet another embodiment of the present invention, a superlattice is provided having alternating layers of lead-telluride (PbTe) and tellurium (Te) (hereafter "PbTe/Te SL"). The insertion of thin undoped Te layers and Bismuth (Bi)-doped PbTe layers into its superlattice structure enables the resulting PbTe/Te SL to retain a PbTe crystal structure while achieving a higher power factor value than bulk PbTe material. If the PbTe crystal structure was not retained, the quality of interfaces would degrade and the thermoelectric properties of the superlattice would be adversely affected. Moreover, the PbTe/Te SL structure has a higher Seebeck coefficient value than bulk PbTe due to quantum effects associated with the superlattice structure.

These high values of the power factor and the Seebeck coefficient for the PbTe/Te SL are not, just as these values for the other lead-chalcogenide superlattices (PbTe/$PbSe_xTe_{1-x}$/Te and PbTe/$PbSe_xTe_{1-x}$) were not, commensurately offset by lower carrier mobilities or electrical conductivities as they were in prior art superlattice structures. Consequently, ZT values approaching one have already been observed for the PbTe/Te SL. Moreover, it is believed that PbTe/Te SL structures are capable of having ZT values that, with optimized interrelationships between their materials properties, could surpass one.

BRIEF DESCRIPTION OF THE DRAWINGS

A more complete understanding of the present invention and the attendant advantages and features thereof will be more readily understood by reference to the following detailed description when it is considered in conjunction with the accompanying drawings, wherein.

DETAILED DESCRIPTION OF THE INVENTION

Figure 1:
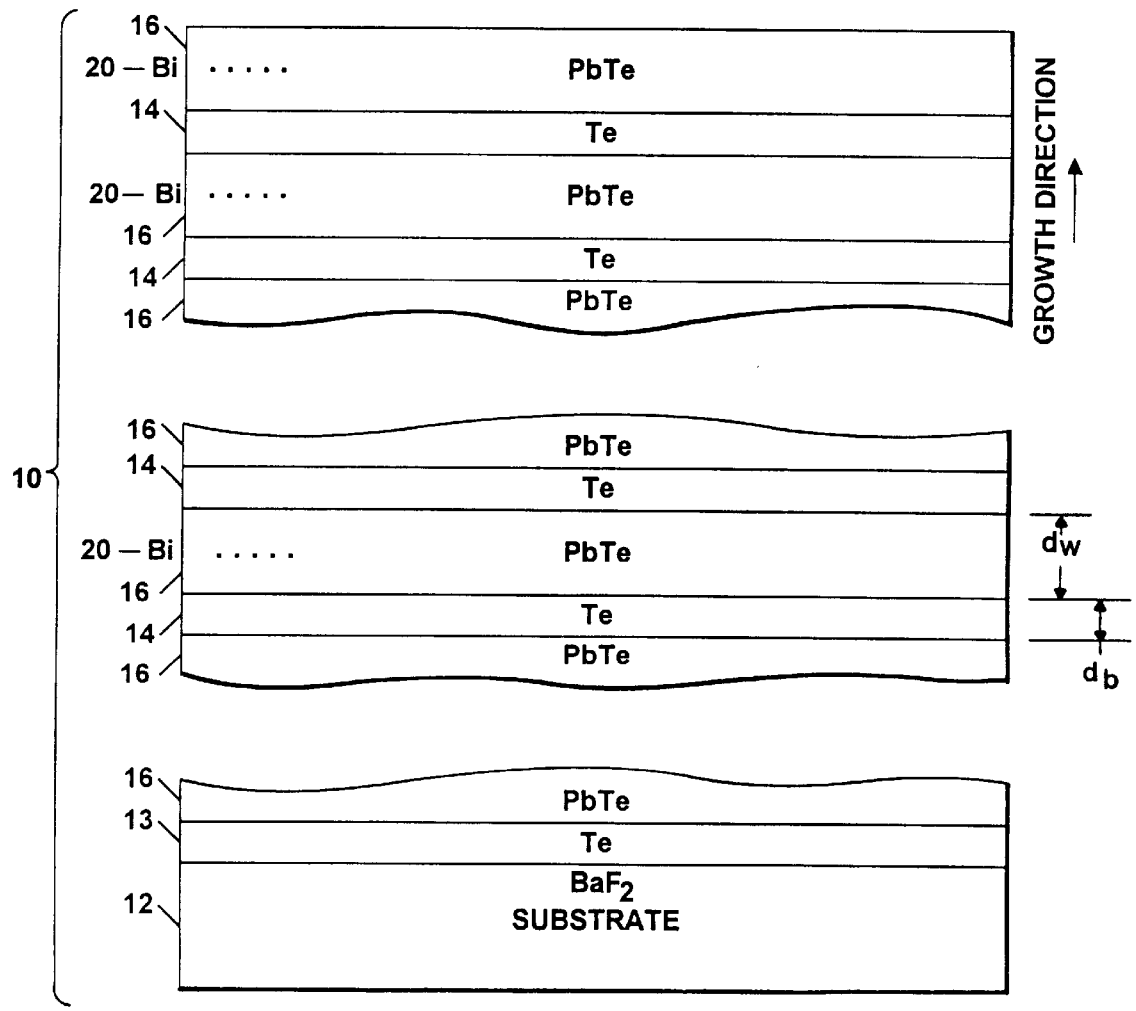
FIG. 1 is a schematic cross-sectional view of a PbTe/Te superlattice structure grown on a $BaF_2$ substrate in accordance with the present invention.

Referring now to FIG. 1, a lead telluride-tellurium (PbTe/Te) superlattice (SL) structure 10 is shown disposed over an insulating barium-fluoride (BaF$_2$) substrate 12 wherein a Te buffer layer 13 is adjacent the BaF$_2$ substrate 12. Those of ordinary skill in the art will appreciate that although buffer layer 13 is here provided as Te, any material which provides a smooth interface for subsequent growth of a superlattice may alternatively be used.

The PbTe/Te SL structure 10 is comprised of m layers of an undoped barrier material 14 alternating with n layers of a doped matrix material 16. The values of m and n are equal, and are typically in the range of 10 to 99,000, with values in the range of about 50 to 450 being preferred and values in the range of about 150 to about 315 being most preferred.

In one embodiment of the present invention, each layer of the barrier material 14 has a thickness d$_b$ in the range of 0.45 to 1.8 nanometers and each layer of the matrix material 16 has a thickness d$_m$ in the range of 14.8 to 29.9 nanometers. In a preferred embodiment, each layer of the barrier material 14 has a thickness d$_b$ in the range of 0.9 to 1.2 nanometers and each layer of the matrix material 16 has a thickness d$_m$ in the range of 14.8 to 29.9 nanometers.

The PbTe/Te SL structure 10 will also have periods, which are equal to the total number of layers (m) of undoped barrier material 14 and also equal to the total number of layers (n) of doped matrix material 16. One period of the PbTe/Te SL structure 10 has a thickness of (d$_b$+d$_m$). The number of periods in the PbTe/Te SL structure 10 is therefore also in the range of about 10 to 99,000, with values in the range of about 50 to 450 being preferred and values in the range of about 150 to about 315 being most preferred.

The layers of undoped barrier material 14 of the PbTe/Te SL structure 10 are comprised of a chalcogen non-metal such as tellurium (Te). The layers of matrix material 16 of the PbTe/Te SL structure are comprised of Group IV metal(s) and chalcogen non-metal(s) such as Pb or Te. The PbTe matrix material layers 16 of the PbTe/Te SL structure 10 are doped with an n-type Group V dopant 20, here Bismuth (Bi), to a dopant concentration in the range of 1.0×10$^{18}$ cm$^{-3}$ to 4.0×10$^{19}$ cm$^{-3}$.

Table I below shows the dimensional parameters of six sample films of different PbTe/Te SL structures 10. Table I lists the respective layer thicknesses, d$_b$ and d$_m$, of the undoped Te barrier material 14 and the uniformly Bi 20 doped PbTe matrix material 16 for each of the six samples of the PbTe/Te SL structures. Table I also lists the number of periods and the total layer thicknesses of the six samples of the PbTe/Te SL structures. In these particular samples, the number of periods was limited to the number of periods which could be grown in one day. Furthermore, the thickness were selected empirically using ZT as a guide.

TABLE I

| | ---Thickness--- | | | |
| Sample Number | Te undoped d$_b$ (nm) | PbTe Bi-doped d$_w$ (nm) | Number of Periods | Sample Thickness (μm) |
| --- | --- | --- | --- | --- |
| T-356A | 0.9 | 21.7 | 203 | 4.59 |
| T-442A | 0.9 | 21.6 | 189 | 4.26 |
| T-443A | 1.1 | 27.1 | 186 | 5.25 |
| T-444B | 1.1 | 26.7 | 189 | 5.25 |
| T-446A | 1.2 | 29.9 | 190 | 5.91 |
| T-447A | 0.9 | 14.8 | 314 | 4.92 |

The combination of the layers of uniformly Bi 20 doped PbTe matrix material 16, and the layers of undoped Te barrier material 14 in the PbTe/Te SL structure gives the PbTe/Te SL structure 10 improved materials properties, such as high values for its Seebeck coefficient and its power factor, that enable the PbTe/Te SL structure to achieve relatively high ZT values as noted in Table II.

TABLE II

| Sample No. | Seebeck Coefficient (μV/K) | Power Factor (μW/ cm - K$^2$) | Z$_{3D}$ T | Carrier Concentration n (cm$^{-3}$) | Carrier Mobility μ (cm$^2$/V - s) |
| --- | --- | --- | --- | --- | --- |
| T-356A | -170 | 44 | 0.50 | 8.3 × 10$^{18}$ | 1060 |
| T-442A | -80 | 27 | 0.21 | 4.0 × 10$^{19}$ | 650 |
| T-443A | -188 | 38 | 0.36 | 2.2 × 10$^{19}$ | 790 |
| T-444B | -163 | 44.5 | 0.49 | 1.3 × 10$^{19}$ | 785 |
| T-446A | -193 | 43 | 0.52 | 8.2 × 10$^{18}$ | 880 |
| T-447A | -203 | 38.5 | 0.48 | 5.8 × 10$^{18}$ | 1015 |

Table II shows the values of certain material properties of the same six samples of the different PbTe/Te SL structures 10 shown in Table I. The values for the Seebeck coefficient, the power factor and the three-dimensional thermoelectric figure of merit are shown for each of the six samples. It should be noted that a literature value of the lattice thermal conductivity of 20 mW/cm-K at 300 K was assumed for all six samples.

As can be observed in Tables I and II, a maximum figure of merit (Z$_{3D}$T) for the six PbTe/Te SL structure samples tested was achieved with Sample No. T-446A, which had a sample thickness of 5.91 μm as provided by 190 superlattice periods. The thicknesses of the doped and undoped layers of Te and PbTe for sample No. T-446A were 1.2 nm and 29.9 nm respectively. Also, the PbTe layers of sample No. T-446A of the PbTe/Te SL structure samples were doped with Bismuth (Bi) to a concentration of $8.2 \times 10^{18}$ cm$^{-3}$.

The data indicates that a quantum resonance scattering mechanism from potential barriers may be occurring. This would explain why both shorter periods and longer period thicknesses do not appear to work as well.

Figure 2:
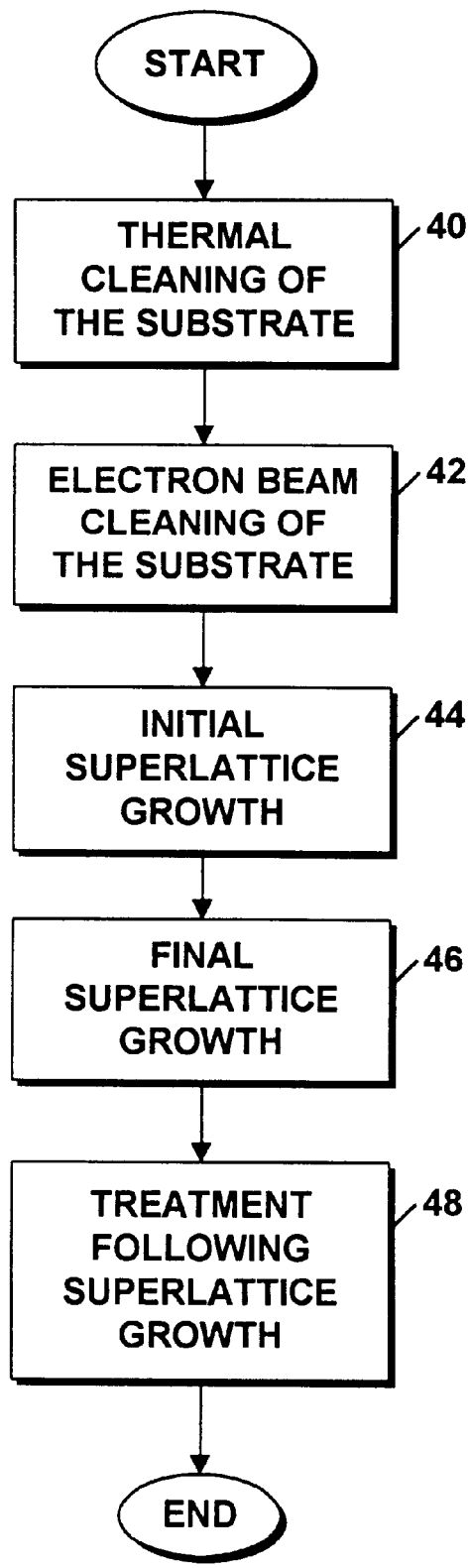
FIG. 2 is a Flow Diagram of the steps of a growth process for a PbTe/Te superlattice structure.

Turning now to FIG. 2, a flow diagram illustrating a process for growing and treating a PbTe/Te superlattice structure is shown. A substrate upon which a PbTe/Te superlattice is to be grown is first prepared by a thermal cleaning step 40, wherein the substrate is outgassed at a temperature of about 500° C. for approximately thirty minutes. The substrate upon which the PbTe/Te or other lead-chalcogenide superlattice structure is to be grown should have material properties, such as lattice constant and coefficient of thermal expansion, that are relatively similar to those of the lead-chalcogenide superlattice structure or other superlattice structure being produced. Barium-fluoride, for example is one preferred substrate material for use with lead-chalcogenide superlattice structures since it is relatively inexpensive, is commercially available and has the unique combination of a relatively close lattice constant match with lead-chalcogenide superlattice as well as a relatively close coefficient of thermal expansion match as mentioned above.

In one particular embodiment, the substrate is outgassed at a temperature of about 490° C. for thirty-two minutes. The thermal cleaning step 40 concludes with the temperature of the substrate being lowered at a rate of 5° C. per minute until a temperature of 350° C. is reached. Typically, the temperature of the substrate is then held at a temperature of about 350° C. for a time period in the range of about thirty to about sixty minutes.

Upon the completion of the thermal cleaning step 40, the substrate is further prepared for superlattice growth during an electron beam cleaning step 42. Electron beam cleaning of the substrate may be provided, for example, via a raster scanning technique in which a RHEED (reflection high-energy electron diffraction) beam undergoes back and forth or raster scanning for a predetermined period of time. In the case where the substrate is provided as barium-fluoride (BaF$_2$), the electron beam (12 kV and 22 $\mu$A) cleaning step 42 lasts for typically about three minutes.

Following the completion of the electron beam cleaning step 42, the substrate is prepared to have a superlattice structure grown thereupon, a segment of the overall process illustrated by the flow diagram of FIG. 2 that begins with an initial superlattice growth step 44. The initial superlattice growth step 44 commences with the introduction of tellurium (Te) from a Te effusion cell onto the surface of the substrate for fifty seconds at a pressure of $2 \times 10^{-7}$ Torr, followed by the application of lead-telluride (PbTe) molecules to the substrate surface.

Initial superlattice growth step 44 continues with the substrate, now containing Pb and Te at a temperature of 350° C. for a ten to thirty minute time period. During a final phase of the initial superlattice growth step 44, the substrate temperature is decreased to a temperature in the range of between about 280° C. to about 340° C. The chamber temperature is maintained at a predetermined level within the above range for about six hours, during which time the background vapor pressure in the chamber is approximately $2 \times 10^{-9}$ Torr.

Once a substrate has completed the initial superlattice growth step 44, the superlattice growth process continues to final superlattice growth step 46 in which the substrate is processed. Final superlattice growth step 46 begins by setting the substrate temperature to a maximum temperature of 300° C. (if the effusion cell is not already at or below that level) and then shutting all of the growth chamber shutters to prevent the introduction of any materials onto the substrate. The temperature of the substrate is then further lowered to 250° C. at a rate of 5° C. per minute. The final superlattice growth step 46 ends after the substrate temperature has been held at 250° C. for fifteen hours, after which the power to the substrate is turned off.

During growth steps 44 and 46, there is an ultra-high vacuum environment present in the chamber. The ultra-high vacuum environment allows for control over, and excellent reproducibility of, the PbTe and Te layers of the superlattice. Moreover, the ultra-high vacuum environment allows for the compositional freedom to grow a wide variety of superlattice structures including, but not limited to, PbTe/Te superlattice structures.

In addition to growing a PbTe/Te superlattice as shown in steps 44 and 46, the process illustrated by the flow diagram of FIG. 2 also contemplates a post-growth treatment of the PbTe/Te superlattice as shown in step 48. If the shutter of the Te effusion cell is opened and the superlattice is kept in the growth chamber for approximately fifteen hours, the superlattice will be annealed in the Te vapor that was reduced from that used in the growth process steps 44 and 46. This annealing stage ensures that the resulting superlattice will not be a mixture of p-type and n-type materials, which would adversely affect the thermoelectric properties of the superlattice.

Bi is an amphoteric impurity in PbTe and annealing in a Te vapor ensures that the Bi atoms are substituted for Pb atoms (here n-type) rather than having some Bi atoms on Te atom sites and exhibiting p-type behavior. It is an undesirable result for Te thermoelectric materials to be a mixture of n-type and p-type. The superlattice post-growth treatment of step 48 ends once the PbTe/Te superlattice is allowed to cool to room temperature and removed from the chamber.

Although the flow diagram of FIG. 2 illustrates pre-growth preparation, growth and post-growth treatment steps in a PbTe/Te superlattice growth process, the process can be slightly modified and reproduced without requiring undue experimentation to produce other lead-chalcogenide superlattices including, but not limited to, PbTe/PbSe$_x$Te$_{1-x}$/Te superlattices, PbTe/PbSe$_x$Te$_{1-x}$ superlattices, and PbPbSe$_x$Te$_{1-x}$/PbPbSe$_y$Te$_{1-y}$ superlattices. Moreover, the equipment and parameters used to perform the steps illustrated in the flow diagram of FIG. 2 can be slightly modified to produce lead-chalcogenide superlattice structures including, but not limited to, the lead-chalcogenide superlattice structures noted above without requiring undue experimentation.

Figure 3:
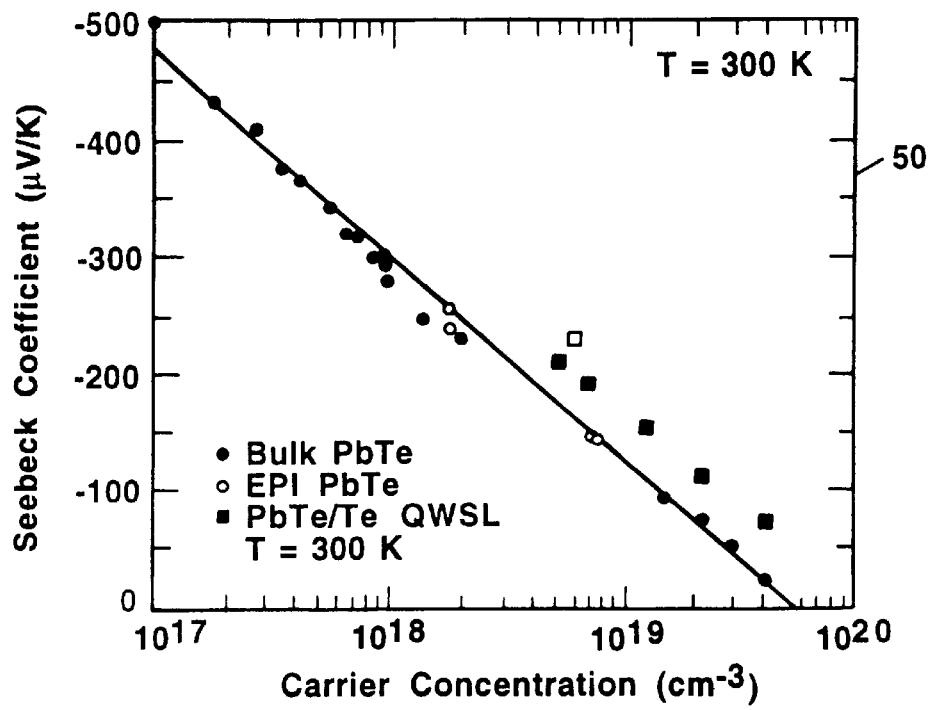
FIG. 3 is a graphical representation of the Seebeck coefficient versus the carrier concentration for n-type bulk PbTe, epitaxial PbTe, and PbTe/Te superlattice structure films.
Figure 4:
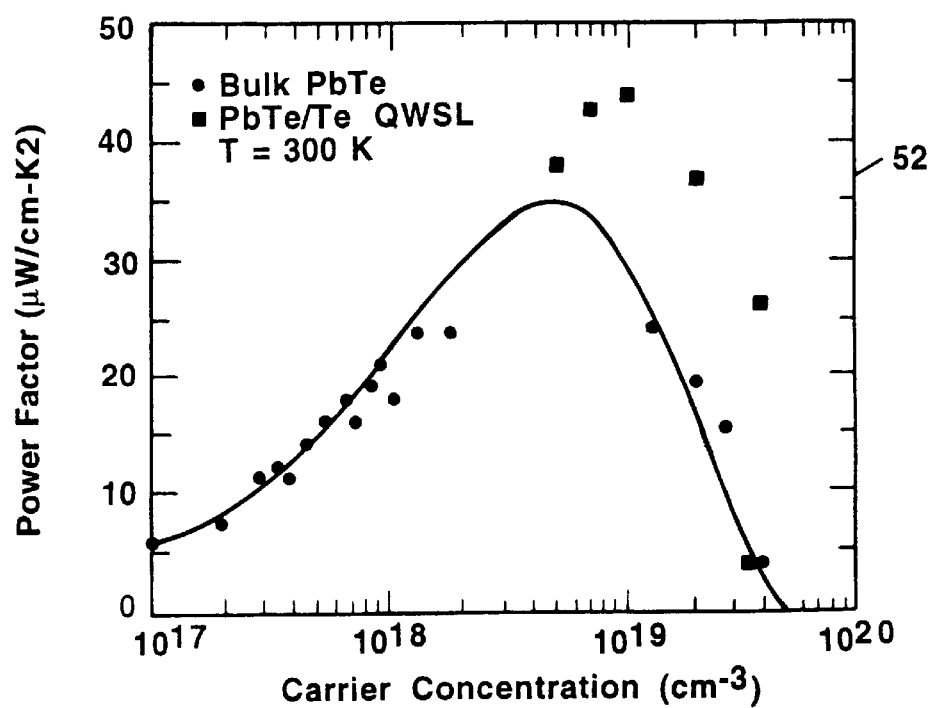
FIG. 4 is a graphical representation of the thermoelectric power factor versus the carrier concentration for n-type bulk PbTe and PbTe/Te superlattice structure films.

Referring now to FIGS. 3 and 4, a graph 50 shows the relationship between the Seebeck coefficient (S) and the carrier concentration (n) of n-type bulk PbTe films, epitaxial PbTe films and PbTe/Te SL films, and a graph 52 shows the relationship between the power factor ($P_F$) and carrier concentration for n-type bulk PbTe films, and PbTe/Te SL structure films.

As described above, the thermoelectric figure of merit ZT is related to the materials properties of thermoelectric materials and thermoelectric materials having a superlattice structure. For convenience, the equation showing the relationship is repeated here as Equation 1.

$$ZT = S^2 \sigma T/\kappa = S^2 ne\mu T/(\kappa_1 + \kappa_e) = P_F T/\kappa = S^2 GT/K \quad \text{(Equation 1)}$$

As can be seen from Equation 1, among the material properties that linearly influence a thermoelectric material's or thermoelectric material having a superlattice structure's thermoelectric figure of merit (ZT) value are its Seebeck coefficient ($S^2$) and its power factor ($P_F$).

While $S^2$ and $P_F$ are linearly proportional to ZT in the above equation, high S and/or $P_F$ values of a thermoelectric material alone do not necessarily translate to a correspondingly high ZT value for that thermoelectric material because of the presence of other materials properties in equation 1. It does follow, however, that it is advantageous for a thermoelectric material or a thermoelectric material having a superlattice structure to have high values for its materials properties that are linearly proportional to ZT in order to increase the likelihood of that thermoelectric material or thermoelectric material having a superlattice structure also having a high ZT value.

Examination of the graphs 50 and 52 in FIGS. 3 and 4 respectively, reveals two patterns. First, a thermoelectric material's or thermoelectric material having a superlattice structure's S and $P_F$ values are capable of changing with changing carrier concentration. Second, for the PbTe/Te SL structure films plotted in graphs 50 and 52, their S and $P_F$ values are higher at higher carrier concentrations than those of the n-type bulk PbTe films and epitaxial PbTe films of the prior art. This is an important result because carrier concentration (n) is, like the square of the Seebeck coefficient (S) and the power factor ($P_F$), linearly proportional to the thermoelectric figure of merit (ZT). Therefore a SL superlattice, like the PbTe/Te SL structure, that has high values for n, S and $P_F$ will likely also have high values for ZT.

Overall, the S and $P_F$ values of the PbTe/Te SL structure films, as compared to the S and $P_F$ values of the n-type bulk PbTe films and epitaxial PbTe films at corresponding carrier concentrations, denote that a PbTe/Te SL structure can possess characteristics whereby the values of its material properties, such as S and $P_F$, are improved over those of n-type bulk PbTe and epitaxial PbTe.

Figure 5:
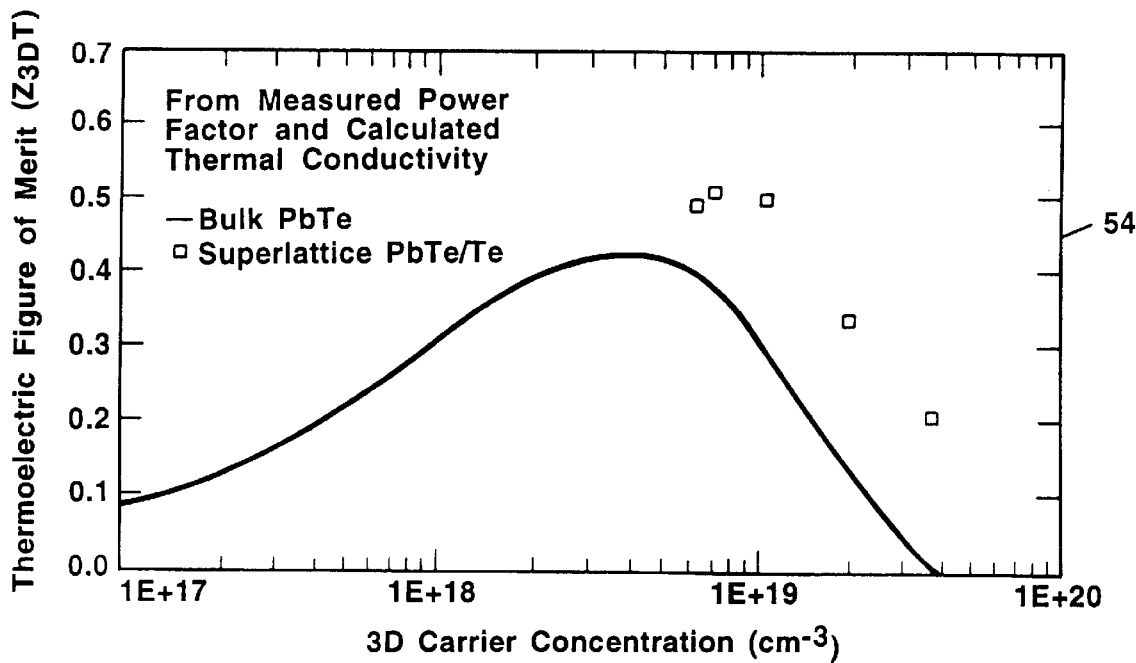
FIG. 5 is a graphical representation of the thermoelectric figure of merit versus the carrier concentration for n-type bulk PbTe, and PbTe/Te superlattice structure films.

Referring now to FIG. 5, a graph 54 shows the relationship between the three-dimensional thermoelectric figure of merit ($Z_{3D}T$ or ZT of equation 1) and the carrier concentration for n-type bulk PbTe films and PbTe/Te superlattice (SL) structure films.

As can also be seen from Equation 1, many material properties influence the ZT value of a thermoelectric material or a thermoelectric material having a superlattice structure. As noted herein, two material properties, the Seebeck coefficient (S) and the power factor ($P_F$), that are linearly proportional to ZT have higher values for PbTe/Te SL structures than for n-type bulk PbTe materials and/or epitaxial PbTe materials.

Although $S^2$ and $P_F$ values are linearly proportional to thermoelectric figure of merit (ZT) values, these proportional relationships, however, do not guarantee that high values for S and/or $P_F$ will necessarily translate to correspondingly high ZT values for a thermoelectric material or a thermoelectric material having a superlattice structure. This is because, as can be seen from equation 1, ZT is also related to several other material properties that are capable of offsetting high S and $P_F$ values.

For example, a PbTe/Te SL structure, although it has high values for its Seebeck coefficient (S) and its power factor ($P_F$) when compared to an n-type bulk PbTe material, has a carrier mobility ($\mu$) value that is lower than the $\mu$ value for n-type bulk PbTe; like the values of $S^2$ and $P_F$, $\mu$ is also linearly proportional to ZT. It would seem likely, therefore, that the low $\mu$ value for a PbTe/Te SL structure would offset any gains to the PbTe/Te SL structure's ZT value that are caused by its high S and $P_F$ values.

Nevertheless, the graph 54 of FIG. 5 shows that the ZT values, either unrelated to or despite the values of other material properties such as carrier mobility ($\mu$) that influence ZT, for some of the same PbTe/Te SL structure films are higher, despite having lower values for $\mu$ than the ZT values for each of the same n-type bulk PbTe films of the prior art that were examined in FIGS. 3 and 4.

Moreover, because a thermoelectric material's or thermoelectric material having a superlattice structure's thermoelectric figure of merit (ZT) value corresponds to that thermoelectric material's or thermoelectric material having a superlattice structure's utility in the fields of power generation systems, and heating and/or cooling applications, it follows that a PbTe/Te SL structure is likely to perform better in these fields than an n-type bulk PbTe thermoelectric material.

Figure 6:
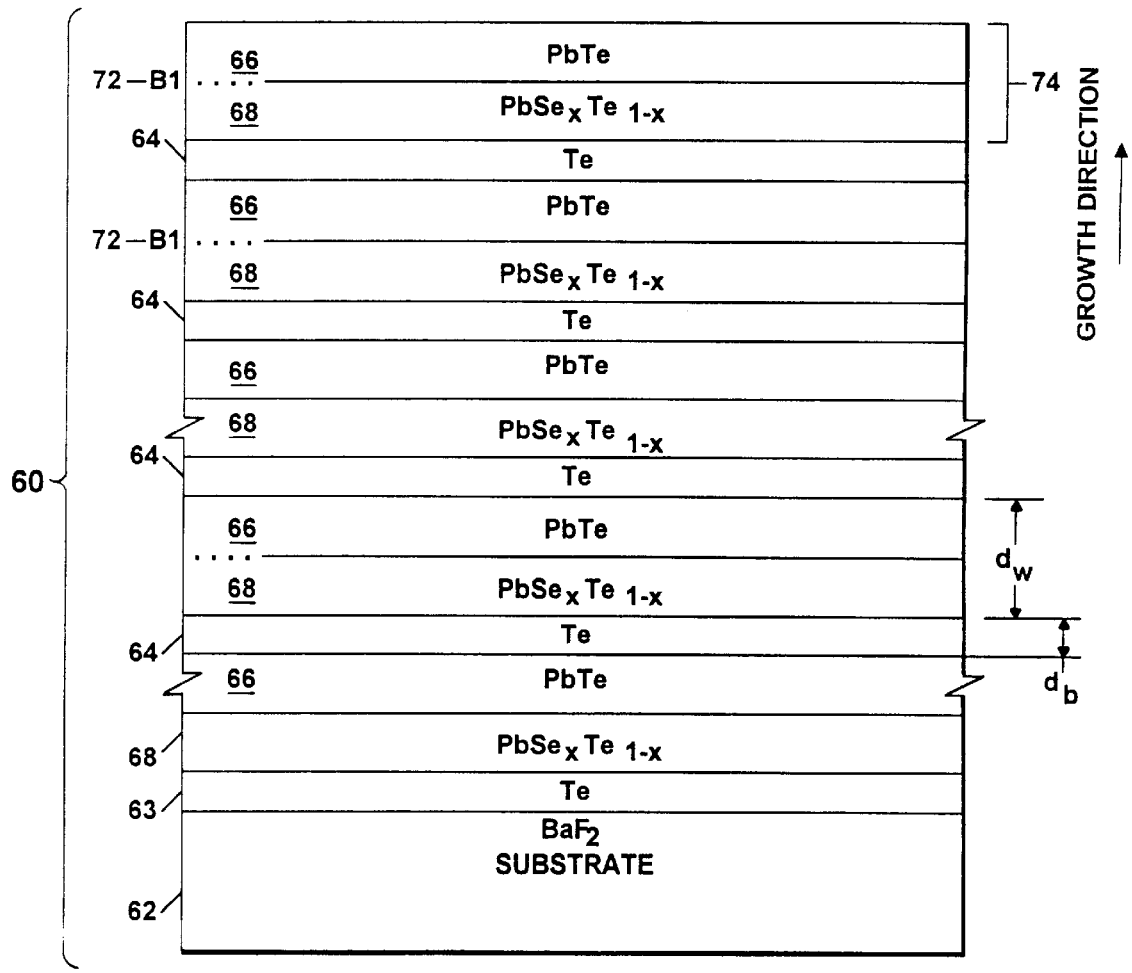
FIG. 6 is a schematic cross sectional view of a PbTe/PbSe$_x$Te$_{1-x}$/Te superlattice grown in accordance with the present invention on a BaF$_2$ substrate.

Referring now to FIG. 6, a schematic cross section of a lead-telluride/lead-selenide-telluride/tellurium (PbTe/PbSeTe/Te) SL structure 60 is shown disposed over an insulating $BaF_2$ substrate 62 wherein a Te buffer layer 63 of the superlattice structure is adjacent to the $BaF_2$ substrate. The PbTe/PbSeTe/Te SL structure 60 has m total layers of an undoped barrier material 64, here Te, and n total layers 74 of matrix materials 66 and 68, here PbTe and PbSeTe respectively.

The m layers of undoped barrier material 64 of the PbTe/PbSeTe/Te SL structure 60 are comprised of a chalcogen non-metal, such as tellurium (Te). The n layers of matrix material 74 of the PbTe/PbSeTe/Te SL structure 60 are comprised of Group IV metal(s), such as lead (Pb), and chalcogen non-metal(s), such as Te and/or selenium (Se). Comprising the n layers of matrix material 74 of the PbTe/PbSeTe/Te SL structure 60 shown in FIG. 6 are an equal number of layers of PbTe matrix material 66 and PbSeTe matrix material 68. Therefore, the number of total layers of each matrix material 66 and 68 is equal to n/2, where n represents the number of total layers of matrix material 74 in the PbTe/PbSeTe/Te superlattice structure 60.

The values of m and n are typically equivalent and in the range of 190 to 195. The PbTe/PbSeTe/Te SL structure 60 will also have periods which are equal to the total number of layers (m) of undoped barrier material 66 and are also equal to the total number of layers 74 (n/2+n/2=n) of matrix materials 66 and 68. The number of periods of the SL structure is therefore also in the range of 190 to 195. The values of m and n, and the number of periods of the PbTe/PbSeTe/Te SL structure 60 herein disclosed can range from the tens into the tens of thousands.

Each layer of Te barrier material 64 of the PbTe/PbSeTe/Te SL structure 60 has a total thickness $d_b$, wherein the value of $d_b$ is in the range of 0.5 to 2.0 nanometers. Each matrix material layer 74 of the PbTe/PbSeTe/Te SL structure 60 has a total thickness $d_m$, wherein the value of $d_m$ is in the range of 1.5 to 30 nanometers. Each matrix material layer 74 is comprised of component layers, wherein the PbTe matrix material component 66 of each matrix material layer has a thickness in the range of 1.5 to 30 nanometers and the PbSeTe matrix material component 68 of each matrix material layer has a thickness in the range of 1.5 to 30 nanometers.

The matrix material layers 74 of the PbTe/PbSeTe/Te SL structure 60 are each doped with an n-type Group V dopant 72, here Bismuth (Bi), to a dopant concentration in the range of $1 \times 10^{18}$ $cm^{-3}$ to $4 \times 10^{19}$ $cm^{-3}$. Although it is preferable to dope both the PbTe matrix material component 66 and each PbSeTe matrix material component 68 of the matrix material layers 74 with an n-type Group V dopant such as Bismuth, it is contemplated that either the PbTe matrix material component or the PbSeTe matrix material component, but not both, may instead be doped with an n-type Group V dopant such as Bismuth. The layers of the Te barrier material 64 and the layers of the matrix materials 74 each have uniform thicknesses $d_b$ and $d_m$.

Table III shows the dimensional parameters of four samples of different PbTe/PbSeTe/Te SL structures 60. Table III lists the respective layer thicknesses, $d_b$ and $d_m$, of the undoped Te barrier material 64 and of the Bi 72 doped PbTe matrix material 66 and Bi doped PbSeTe matrix material 68 of the four samples of the PbTe/PbSeTe/Te SL structure 60. Table III also outlines the number of periods and the total layer thicknesses of the four samples of the PbTe/PbSeTe/Te SL structures 60.

TABLE III

| | ---Thickness--- | | | |
|---|---|---|---|---|
| Sample Number | Te undoped d (mn) | PbTe Bi-doped d (nm) | PbSeTe Bi-doped d (nm) | Number of Periods | Sample Thickness ($\mu$m) |
| T-456D | 0.5–20 | 18 | 1.5 | 192 | 3.9 |
| T-457B | 0.5–20 | 18 | 1.5 | 195 | 3.4 |
| T-459B | 0.5–20 | 22 | 2 | 190 | 4.6 |
| T-459C | 0.5–20 | 22 | 2 | 190 | 4.6 |

The combination of the presence of the layers of uniformly Bi 72 doped matrix materials 74, and the layers of undoped Te barrier material 64 gives the PbTe/PbSeTe/Te SL structure 60 improved materials properties such as a high values for its Seebeck coefficient and its power factor, that enable the PbTe/PbSeTe/Te SL structure to achieve high ZT values as noted in Table IV.

TABLE IV

| Sample No. | Seebeck Coefficient ($\mu$V/K) | Power Factor ($\mu$W/cm – K$^2$) | $Z_{3D}$ T | Carrier Concentration n (cm$^{-3}$) | Carrier Mobility $\mu$ (cm$^2$/V – s) |
|---|---|---|---|---|---|
| T-456D | −171 | 37 | 0.58 | 9.4 × 10$^{18}$ | 840 |
| T-457B | −170 | 37 | 0.551 | 8.7 × 10$^{18}$ | 920 |
| T-459B | −180 | 42 | 0.64 | 1.0 × 10$^{19}$ | 780 |
| T-459C | −171 | 49.5 | 0.69 | 1.5 × 10$^{19}$ | 720 |

Table IV shows the values of certain materials properties of the same four samples of PbTe/PbSeTe/Te SL structures 60 outlined in Table III. It should be noted that in the computation of the three-dimensional thermoelectric figure of merit ($Z_{3D}$T) values a literature value for the equivalent homogeneous bulk PbSeTe lattice thermal conductivity of 14 mW/cm-K was assumed for all four samples.

The values for the Seebeck coefficients, the power factors and the three-dimensional thermoelectric figures of merit for the four samples of PbTe/PbSeTe/Te SL structures 60 are all shown in Table IV. As can be seen from Tables III and IV, a maximum figure of merit ($Z_{3D}$T) was achieved with Sample No. T459C, which had a sample thickness of 4.6 $\mu$m as provided by 190 superlattice periods. The thicknesses of the layers of PbTe/PbSeTe/Te and PbTe in sample No. T-459C were 2 and 22 nm respectively. Also, the PbTe and PbSeTe layers in samples No. T-459C were doped with Bismuth (Bi) to a concentration of 8.2×10$^{18}$ cm$^{-3}$. Based on the above, the power factor enhancement mechanism described in PbTe/Te superlattices is valid not only for Pb but also for PbSeTe/Te alloys and various other combinations.

Therefore, the data in Tables I, II, III and IV indicate that the values of the material properties, such as the Seebeck coefficient and the power factor, for lead-chalcogenide superlattice structures can advantageously interrelate to provide a thermoelectric material having a lead-chalcogenide superlattice structure with a high thermoelectric figure of merit.

Figure 7:
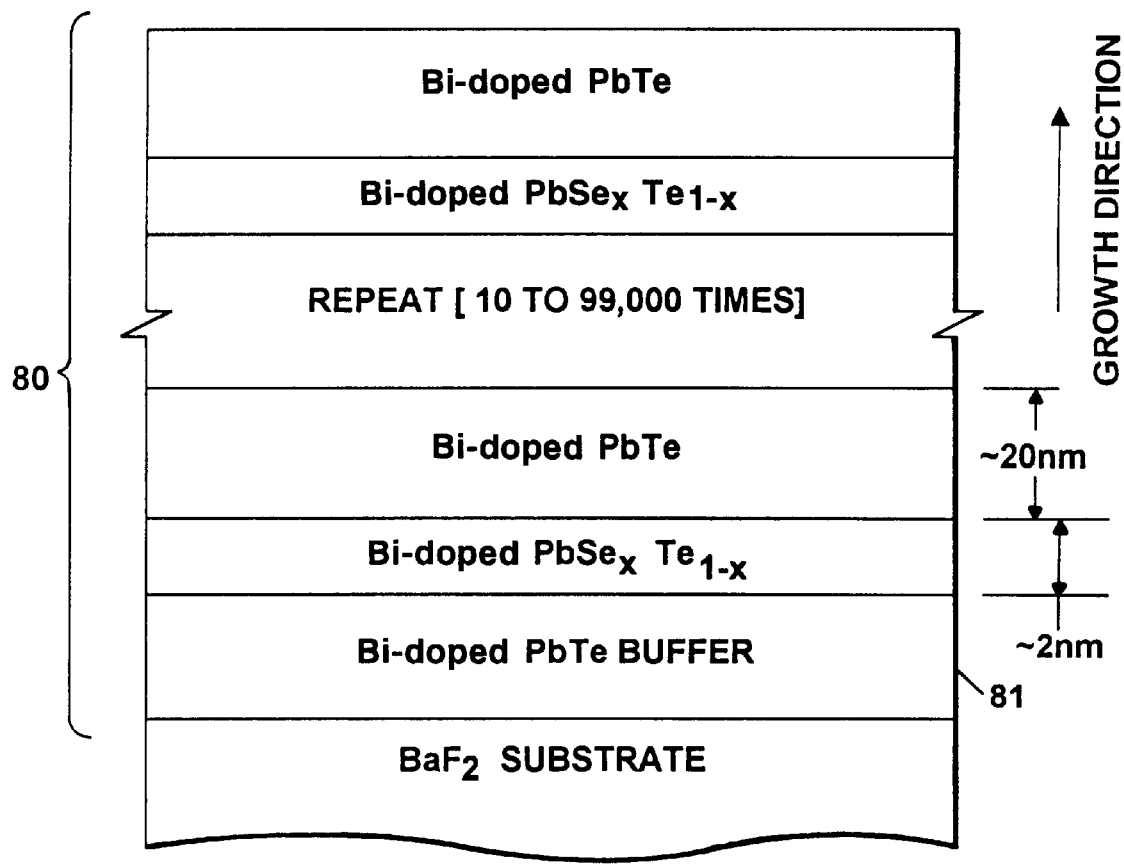
FIG. 7 is a schematic cross-sectional view of an alternative embodiment of the superlattice of FIG. 6.

Referring now to FIG. 7, a schematic cross section of an additional embodiment of the present invention is shown. Specifically, FIG. 7 is a schematic cross section of a lead-telluride/lead-selenide-telluride (PbTe/PbSeTe) superlattice (SL) structure 80. The PbTe/PbSeTe SL structure 80 of FIG. 7 is similar to the PbTe/PbSeTe/Te SL structure 60 of FIG. 6, except that it does not have any Te barrier layers nor does it have a Te buffer layer included in its structure. The PbTe/PbSeTe SL structure 80 has, instead of a Te layer that is adjacent to the barium-fluoride (BaF$_2$) substrate in the other SL structures shown in FIGS. 1 and 6–7, a bismuth (Bi)-doped PbTe buffer layer 81 disposed adjacent to its BaF$_2$ substrate.

Those of ordinary skill in the art will appreciate that although the buffer layer in the lead-chalcogenide superlattice structures of FIGS. 1 and 6–7 is either provided as Te or as (Bi)-doped PbTe, any material which provides a smooth interface for subsequent growth of a superlattice may alternatively be used to provide a buffer layer for a lead-chalcogenide superlattice structure of the present invention.

In the embodiments of the present invention shown in FIGS. 6 and 7, the PbSeTe matrix material layer of the superlattice structure can be denoted as PbSe$_x$Te$_{1-x}$ where x, in these embodiments, equals 0.98 due to an overpressure of Te used in conjunction with the introduction of a stream of PbSe molecules during the superlattice growth steps 44 and 46 of the process shown in FIG. 2. It is contemplated that $0 \leq x \leq 1$ in the embodiments of the present invention shown in FIGS. 6 and 7. Moreover, x is not required to equal 0.98 in the PbSe$_x$Te$_{1-x}$ matrix material layer of the superlattice structure in the embodiments of the present invention shown in FIGS. 6 and 7.

Additionally, it is also contemplated that other lead-chalcogenide superlattice structures including, but not limited to PbSe$_x$Te$_{1-x}$/PbSe$_y$Te$_{1-y}$, could be grown using a process similar to that outlined in FIG. 2 and would have material properties and would exhibit thermoelectric behavior similar to that of the lead-chalcogenide superlattice structures of FIGS. 1 and 6–7.

Figure 8:
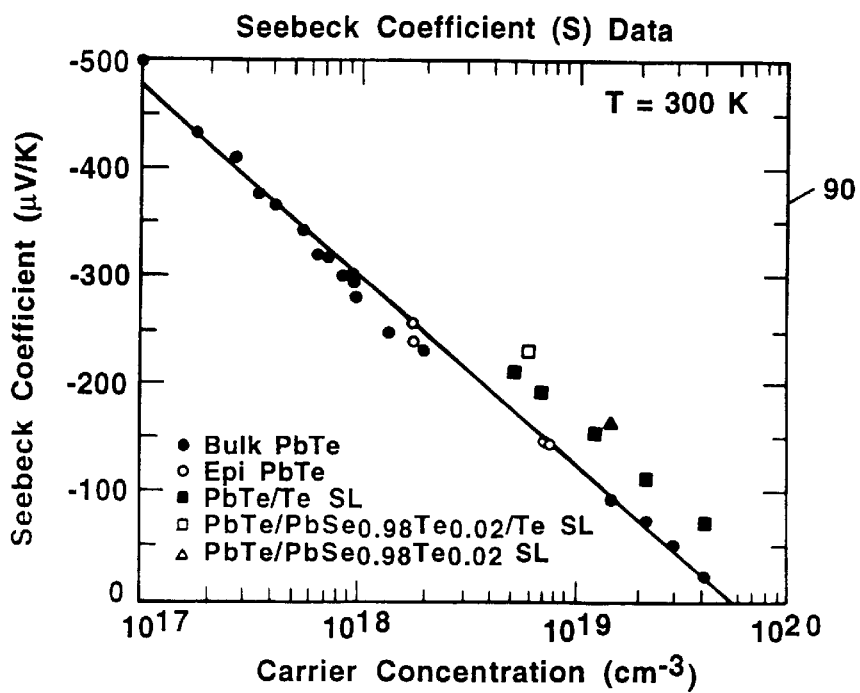
FIG. 8 is a graphical representation of the Seebeck coefficient versus the carrier concentration for n-type bulk PbTe, epitaxial PbTe, PbTe/Te superlattice structure, PbTe/PbSe$_{0.98}$Te$_{0.02}$/Te superlattice structure, and PbTe/PbSe$_{0.98}$Te$_{0.02}$ superlattice structure films.

Referring now to FIG. 8, a graph 90 shows the relationship between the Seebeck coefficient (S) and the carrier concentration (n) for several of the embodiments of the present invention as well as several examples of prior art thermoelectric materials. The graph 90 reproduces the plots that were included and described in FIG. 3, those of n-type bulk PbTe thermoelectric material films of the prior art, epitaxial PbTe films of the prior art, and PbTe/Te SL structure films of the present invention.

The graph 90 of FIG. 8 combines, on the same axes and with the same scale, the plots of FIG. 3 with plots of two other SL structures of the present invention: PbTe/PbSe$_{0.98}$Te$_{0.02}$/Te SL structure films and PbTe/PbSe$_{0.98}$Te$_{0.02}$ SL structure films (as illustrated in FIGS. 7 and 8 respectively). Although the Seebeck coefficients (S) of the PbTe/PbSe$_{0.98}$Te$_{0.02}$/Te and PbTe/PbSe$_{0.98}$Te$_{0.02}$ SL structure films at various carrier concentrations are noted on graph 90, the present invention also contemplates those SL structures having compositions of PbTe/PbSe$_x$Te$_{1-x}$ and PbTe/PbSe$_x$Te$_{1-x}$/Te where $0 \leq x \leq 1$.

Again recalling the equation for calculating a material's thermoelectric figure of merit:

$$ZT = S^2\sigma T/\kappa = S^2 n e \mu T/(\kappa_1 + \kappa_e) = P_F T/\kappa = S^2 GT/K \quad \text{(Equation 1)}$$

the graph 90 of the S values versus the carrier concentrations of five different thermoelectric materials and thermoelectric materials having a superlattice structure serves to emphasize many of the same points noted herein in reference to FIG. 3. The graph 90 also, however, stresses that the high S values of the PbTe/Te, PbTe/PbSe$_{0.98}$Te$_{0.02}$ and PbTe/PbSe$_{0.98}$Te$_{0.02}$/Te SL structures at high carrier concentrations, as compared to the S values of the n-type bulk PbTe films and the epitaxial PbTe films of the prior art at the same high carrier concentrations, indicate that all of those superlattice structures possess characteristics whereby the values of their material properties, such as S, are improved over those of n-type bulk PbTe and epitaxial PbTe thermoelectric materials of the prior art.

Thus, the graph 90, as shown in FIG. 8, of the Seebeck coefficient (S) values versus the carrier concentrations of several lead-chalcogenide SL structures of the present invention and of several thermoelectric materials of the prior art demonstrates that those SL structure films have higher S values than n-type bulk PbTe and epitaxial PbTe films of the prior art, and, therefore, that thermoelectric materials having a superlattice structure like those of the present invention have an increased likelihood of having higher values for their thermoelectric figures of merit (ZT) than prior art n-type bulk PbTe and epitaxial PbTe.

Figure 9:
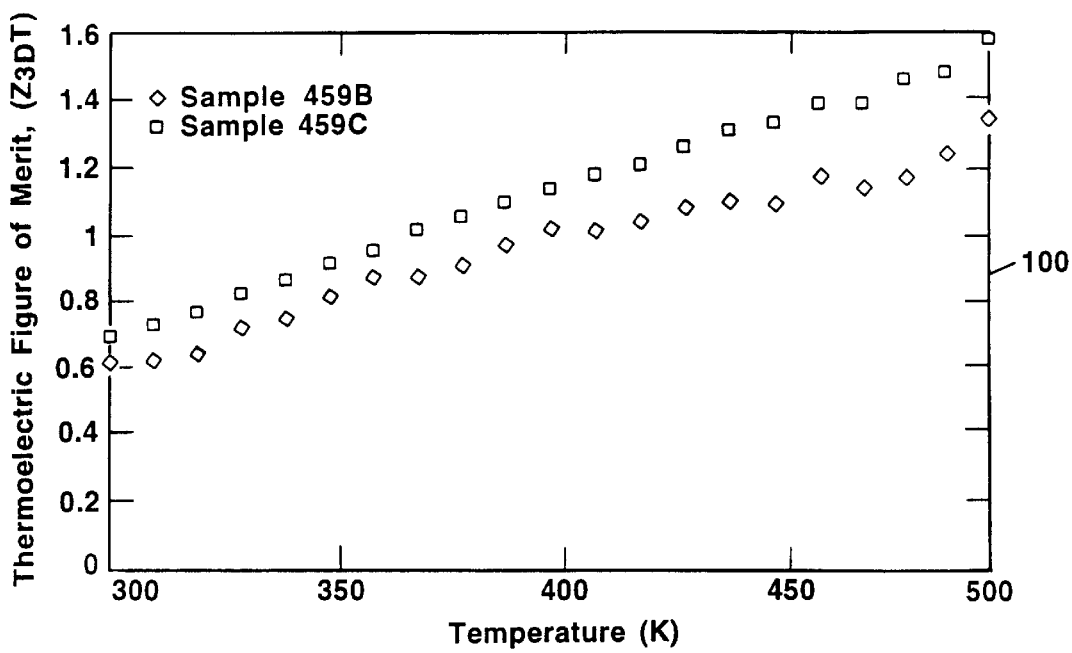
FIG. 9 is a graphical representation of the thermoelectric figure of merit versus temperature for two PbTe/PbSe/Te superlattice structure films.

Referring now to FIG. 9, a graph 100 shows the three-dimensional thermoelectric figure of merit ($Z_{3D}T$) values for two PbTe/PbSeTe/Te SL films of the present invention (corresponding to the superlattice of FIG. 6 and sample Nos. T-459B and T-459C in Tables III and IV). Table IV lists values for the Seebeck coefficient (S), the power factor ($P_F$), the carrier concentration (n), the carrier mobility ($\mu$) and the three-dimensional thermoelectric figure of merit ($Z_{3D}T$) for the two PbTe/PbSeTe/Te SL structure sample Nos. T-459B and T-459C. These materials properties are related to $Z_{3D}T$ as shown in the following equation:

$$Z_{3D}T = S^2\sigma T/\kappa = S^2 n e \mu T/(\kappa_1 + \kappa_e) = P_F T/\kappa = S^2 GT/K \quad \text{(Equation 1)}$$

The $Z_{3D}T$ values for the T-459B and T459C samples, as indicated by Table IV and graph 100, rise with temperature and, more importantly, are high despite low values for $\mu$, a material property that is linearly proportional to $Z_{3D}T$. The high $Z_{3D}T$ values for samples Nos. T-459B and T459C of PbTe/PbSeTe/Te SL structure films are therefore primarily attributable to their high n and $P_F$ values, which are also directly proportional to $Z_{3D}T$ and which apparently more than compensate for the low values of $\mu$.

The data shown in graph 100 of FIG. 9 demonstrates three things. First, although many interrelated material properties influence a thermoelectric material's or thermoelectric material having a superlattice structure's $Z_{3D}T$ value, the material properties, despite the suggestions of the prior art, can, for certain thermoelectric materials having a superlattice structure (such as PbTe/PbSeTe/Te SL structures), interrelate advantageously to produce high $Z_{3D}T$ values.

A related second point is that thermoelectric materials having a superlattice structure are capable of having high $Z_{3D}T$ values despite having low values for one or more of their material properties that are included in equation 1. For example, both the PbTe/PbSeTe/Te SL structure (as shown in FIG. 5) and the PbTe/Te structure (as shown in FIG. 1) have values for their carrier mobilities ($\mu$) that are lower than the $\mu$ values for n-type bulk PbTe, yet both of these SL structures have $Z_{3D}T$ values (as shown in Tables II and IV and FIGS. 5 and 10) that are well above the ZT values (as shown in FIG. 5) of n-type bulk PbTe.

Third, because a PbTe/PbSeTe/Te superlattice structure has high values for its three-dimensional thermoelectric figure of merit ($Z_{3D}T$), and because a thermoelectric material's or a thermoelectric material having a superlattice structure's $Z_{3D}T$ value corresponds to that thermoelectric material's or thermoelectric material having a superlattice structure's utility in power generation systems and heating and/or cooling applications, a PbTe/PbSeTe/Te SL structure is likely to perform better in these applications than an n-type bulk PbTe thermoelectric material.

Figure 10:
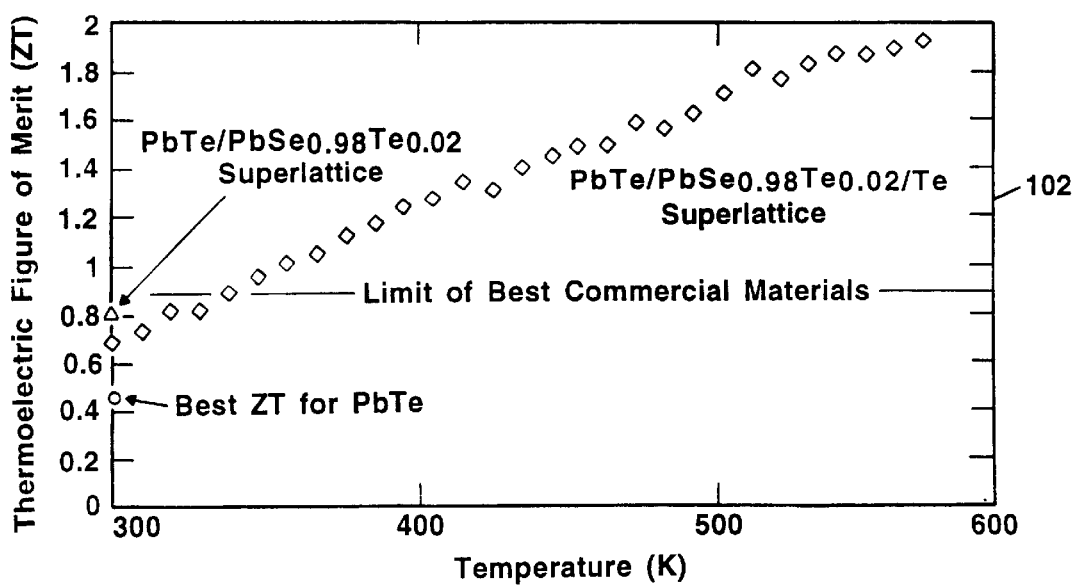
FIG. 10 is a graphical representation of the thermoelectric figure of merit versus temperature for a PbTe/PbSe$_{0.98}$Te$_{0.02}$ superlattice structure and for PbTe/PbSe$_{0.98}$Te$_{0.02}$/Te superlattice films in comparison to prior art thermoelectric commercial materials.

Referring now to FIG. 10 a graph 102 shows the thermoelectric figure of merit (ZT) for several thermoelectric materials plotted versus temperature. This graph 102 provides a comparative frame of reference for the ZT values and, consequently, the likely behaviors in the fields of power generation systems and heating and/or cooling applications of four "materials:" n-type bulk PbTe (a prior art thermoelectric material), all other prior art thermoelectric commercial materials, a PbTe/PbSe$_{0.98}$Te$_{0.02}$/Te SL superlattice in accordance with the present invention (as shown in FIG. 6) and a PbTe/PbSe$_{0.98}$Te$_{0.02}$ SL superlattice in accordance with the present invention (as shown in FIG. 7). Although PbTe/PbSe$_{0.98}$Te$_{0.02}$/Te and PbTe/PbSe$_{0.98}$Te$_{0.02}$ SL structures are noted on graph 102, the present invention also contemplates SL structures having compositions of PbTe/PbSe$_x$Te$_{1-x}$/Te and PbTe/PbSe$_x$Te$_{1-x}$ where $0 \leq x \leq 1$.

The graph 102 demonstrates that other thermoelectric materials having a superlattice structure (besides PbTe/Te superlattice structures and PbTe/PbSeTe/Te superlattice structures) that include layers comprising at least one metal selected from group IV of the periodic table (of which lead (Pb) is one example) and at least one non-metal chalcogen (a group VI element of the periodic table of which selenium (Se) and tellurium (Te) are two examples) also have material properties that advantageously interrelate so as to produce a high $Z_{3D}T$ value for that particular superlattice structure; this, in turn, indicates that thermoelectric materials having such a superlattice structure will perform well in the fields of power generations systems, and heating and/or cooling applications.

Additionally, the graph 102 of FIG. 10 (as well as those in FIGS. 5 and 10) shows the large difference between the thermoelectric figure of merit (ZT) values of prior art thermoelectric materials and of all of the present invention's lead-chalcogenide superlattice structures.

This invention contemplates both further changing the compositions and ratios of the lead-chalcogenide superlattice structures herein disclosed and also further disclosing and experimenting upon other lead-chalcogenide superlattice structures.

What is claimed is:

1. A superlattice structure comprising:
   a first plurality of layers formed from material $D_zJ_{1-z}$;
   a second plurality of layers formed from material $L_xM_{1-x}D_zJ_{1-z}$;
   a third plurality of layers formed from material $L_xM_{1-x}D_zJ_{1-z}$; and
   wherein D is a Group VI non-metal selected from the group of Te, Se, and S, J is a group VI non-metal selected from the group of Te, Se, and S, L is a group IV metal selected from the group of Pb, Sn, and Ge, M is a Group IV metal selected from the group of Pb, Sn, and Ge, D is not the same as J, L is not the same as M, $0 \leq x \leq 1$ and $0 \leq z \leq 1$.

2. The superlattice structure of claim 1 wherein the first plurality of layers are formed from Te.

3. The superlattice structure of claim 2 wherein at least one of the second plurality of layers and the third plurality of layers is formed from PbTe.

4. The superlattice structure of claim 3 wherein the one of the second plurality of layers and the third plurality of layers formed from PbTe are substantially uniformly doped with Bi.

5. The superlattice structure of claim 2 wherein at least one of the second plurality of layers and the third plurality of layers is formed from PbSe.

6. The superlattice structure of claim 1 wherein each of the first plurality of layers has a thickness on the order of 0.5 nm to 1.5 nm, each of the second plurality of layers has a thickness on the order of 10 nm to 50 nm and each of the third plurality of layers has a thickness on the order of 10 nm to 50 nm.

7. The superlattice structure of claim 1 having a thermoelectric figure of merit in the quantum well ($Z_{3D}T$) on the order of 0.92 at 400° K.

8. The superlattice structure of claim 1 wherein the first plurality of layers, the second plurality of layers and the third plurality of layers are formed by molecular beam epitaxy.

9. The superlattice structure of claim 1 further comprising a substrate having a first surface and a second opposed surface, wherein the first plurality of layers, the second plurality of layers and the third plurality of layers are disposed adjacent to the second surface of the substrate.

10. The superlattice structure of claim 9 wherein the substrate is comprised of $BaF_2$.

11. The superlattice structure of claim 1 wherein a period comprises one layer of the first plurality of layers, one layer of the second plurality of layers and one layer of the third plurality of layers and wherein the superlattice structure comprises on the order of between 50 to 10,000 periods.

12. A thermoelectric device comprising:
(a) a substrate having a first surface and a second opposed surface; and
(b) a superlattice structure having a first surface disposed adjacent to the second surface of the substrate and a second opposed surface, the superlattice structure comprising:
(i) a first plurality of layers formed from material $D_xJ_{1-z}$;
(ii) a second plurality of layers formed from material $L_xM_{1-x}D_zJ_{1-z}$;
(iii) a third plurality of layers formed from material $L_xM_{1-x}D_zJ_{1-z}$; and wherein D is a Group VI non-metal selected from the group of Te, Se, and S, J is a Group VI non-metal selected from the group Te, Se, and S, L is a Group IV metal selected from the group of Pb, Sn and Ge, M is a Group IV metal selected from the group of Pb, Sn and Ge, D is not the same as J, L is not the same as M, $0 \leq x \leq 1$ and $0 \leq z \leq 1$.

13. The thermoelectric device of claim 12 wherein the first plurality of layers are formed from Te.

14. The thermoelectric device of claim 13 wherein at least one of the second plurality of layers and the third plurality of layers is formed from PbTe.

15. The thermoelectric device of claim 14 wherein the one of the second plurality of layers and the third plurality of layers formed from PbTe are substantially uniformly doped with Bi.

16. The thermoelectric device of claim 13 wherein at least one of the second plurality of layers and the third plurality of layers is comprised of PbSe.

17. The thermoelectric device of claim 12 wherein the substrate is comprised of $BaF_2$.

18. A superlattice structure comprising:
a first plurality of layers of Te; and
a second plurality of layers of PbTe disposed in alternating relationship with the first plurality of layers of Te.

19. The superlattice structure of claim 18 wherein the second plurality of layers of PbTe are substantially uniformly doped with Bi.

20. The superlattice structure of claim 18 wherein each of the first plurality of layers of Te has a thickness on the order of 0.5 nm to 1.5 nm and each of the second plurality of layers of PbTe has a thickness on the order of 10 nm to 50 nm.

21. The superlattice structure of claim 18 wherein the first plurality of layers of Te and the second plurality of layers of PbTe are formed by molecular beam epitaxy.

22. The superlattice structure of claim 18 having a thermoelectric figure of merit in the quantum well ($Z_{3D}T$) on the order of 0.92 at 400° K.

23. The superlattice structure of claim 18 further comprising a third plurality of layers of PbSe disposed in alternating relationship with the first plurality of layers of Te and the second plurality of layers of PbTe.

24. The superlattice structure of claim 18 further comprising a substrate having a first surface and a second opposed surface, wherein the first plurality of layers of Te and second plurality of layers of PbTe are disposed adjacent to the second surface of the substrate.

25. The superlattice structure of claim 24 wherein the substrate is comprised of $BaF_2$.

* * * * *

UNITED STATES PATENT AND TRADEMARK OFFICE
CERTIFICATE OF CORRECTION

PATENT NO. : 6,060,657             Page 1 of 1
DATED : May 9, 2000
INVENTOR(S) : Theodore C. Harman It is certified that error appears in the above-identified patent and that said Letters Patent is hereby corrected as shown below:

Column 3,
Lines 21, and 22, delete "$L_xM_{1-x}D_zJ_{1-x}$" and replace with -- $L_xM_{1-x}D_zJ_{1-z}$ --.

Column 15,
Line 11, delete "superiattice" and replace with -- superlattice --.

Signed and Sealed this

Fourteenth Day of August, 2001

*Attest:*

NICHOLAS P. GODICI
*Attesting Officer*     Acting Director of the United States Patent and Trademark Office